(12) United States Patent
Hiroshima et al.

(10) Patent No.: US 7,208,788 B2
(45) Date of Patent: Apr. 24, 2007

(54) SEMICONDUCTOR DEVICE AND MANUFACTURING METHOD THEREOF

(75) Inventors: Masahito Hiroshima, Tokyo (JP); Takashi Nishida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/995,134

(22) Filed: Nov. 24, 2004

(65) Prior Publication Data
US 2005/0116272 A1 Jun. 2, 2005

(30) Foreign Application Priority Data
Nov. 28, 2003 (JP) ............... 2003-399996

(51) Int. Cl.
*H01L 29/73* (2006.01)
(52) U.S. Cl. .............. 257/296; 257/309; 257/310; 257/311; 257/297
(58) Field of Classification Search ......... 257/309, 257/310, 311, 307, 297; 438/243, 244, 396, 438/398
See application file for complete search history.

(56) References Cited

U.S. PATENT DOCUMENTS 6,703,273 B2 * 3/2004 Wang et al. .......... 438/243

2002/0072190 A1 * 6/2002 Lee et al. ............... 438/396

FOREIGN PATENT DOCUMENTS

JP 10-242417 9/1998

OTHER PUBLICATIONS

"Nikkei Microdevices vol. 11" pp. 86-87, Nikkei Business Publications. Inc., Nov. 1, 2003, Flat Panels: Battleground for 2nd TV War.

* cited by examiner

*Primary Examiner*—Thomas Dickey
*Assistant Examiner*—Fazli Erdem
(74) *Attorney, Agent, or Firm*—Young & Thompson

(57) ABSTRACT

A semiconductor device and a manufacturing method thereof in which the peripheral length of an aperture and the mechanical strength of cylinders in a cell can be increased without changing the occupation rate of patterns in the cell. By forming a slit in the middle of each mask pattern so as not to expose parts of wafer, the aperture of the wafer becomes nearly cocoon-shaped with a constriction in the middle. Thereby, the peripheral length of the aperture can be increased without changing the occupation rate of the mask patterns in a cell. Further, the shape of the bottom of the aperture also becomes nearly cocoon-shaped with a constriction in the middle, and therefore it is possible to increase the mechanical strength of cylinders.

4 Claims, 8 Drawing Sheets

F I G. 1
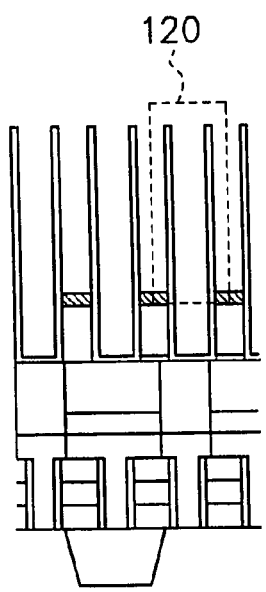 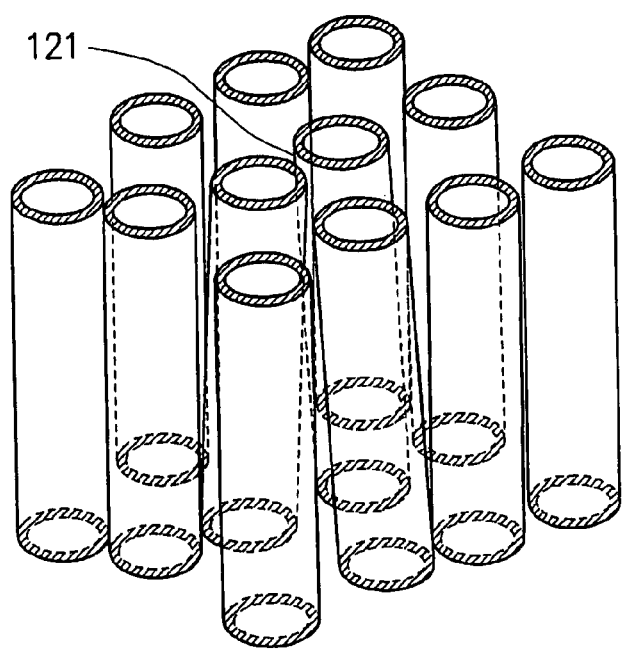
(a)　　　　　　　　　(b)
PRIOR ART　　　　　PRIOR ART

F I G. 6
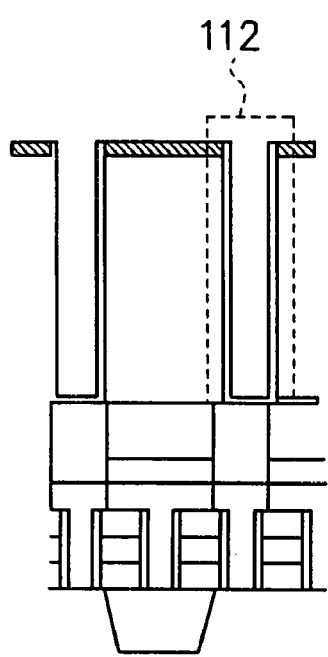 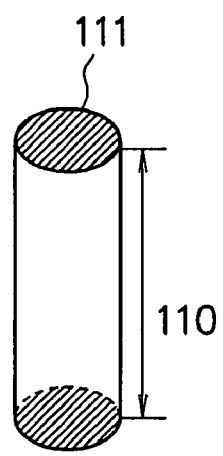 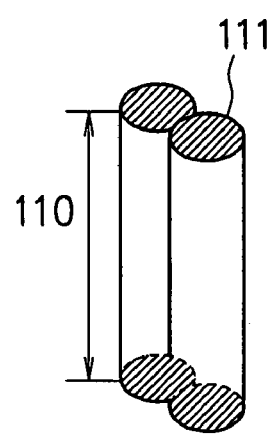
(a) (b) (c)

F I G. 7
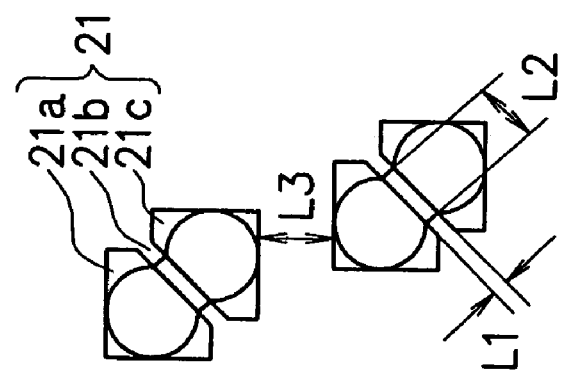
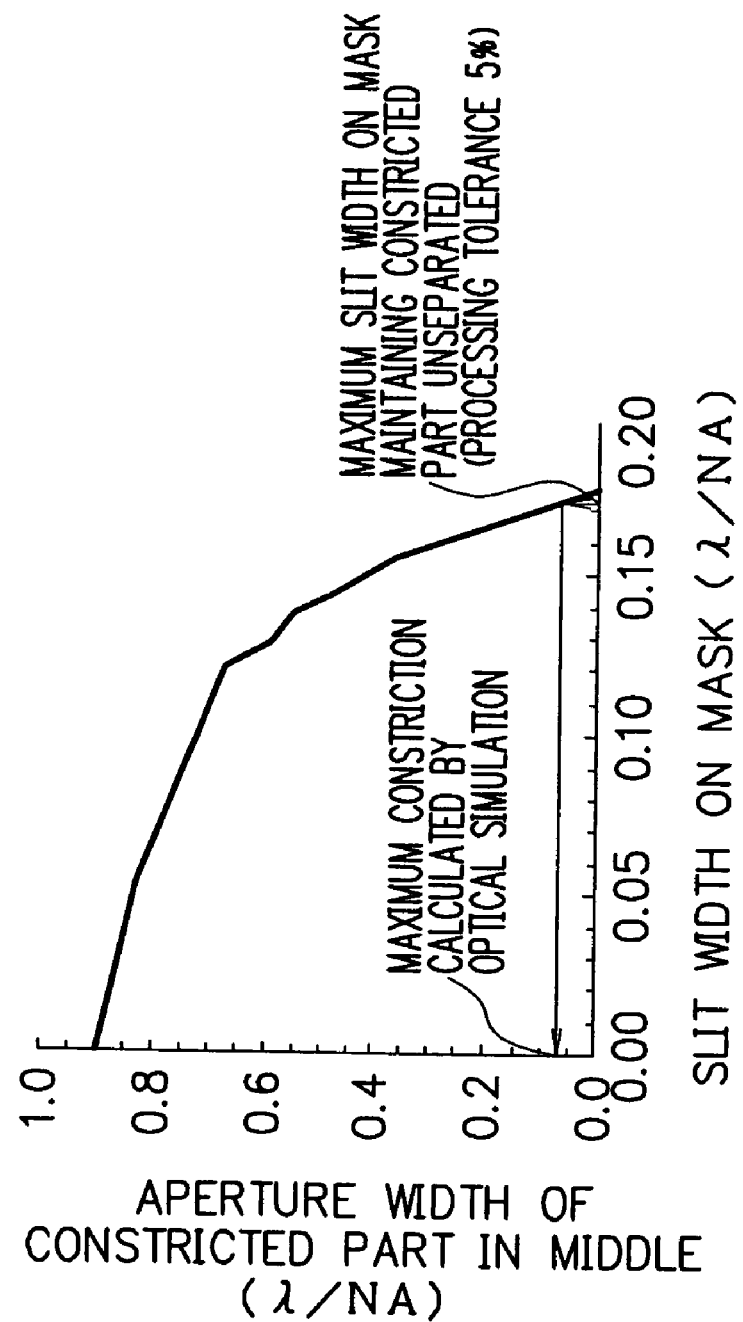

F I G. 12
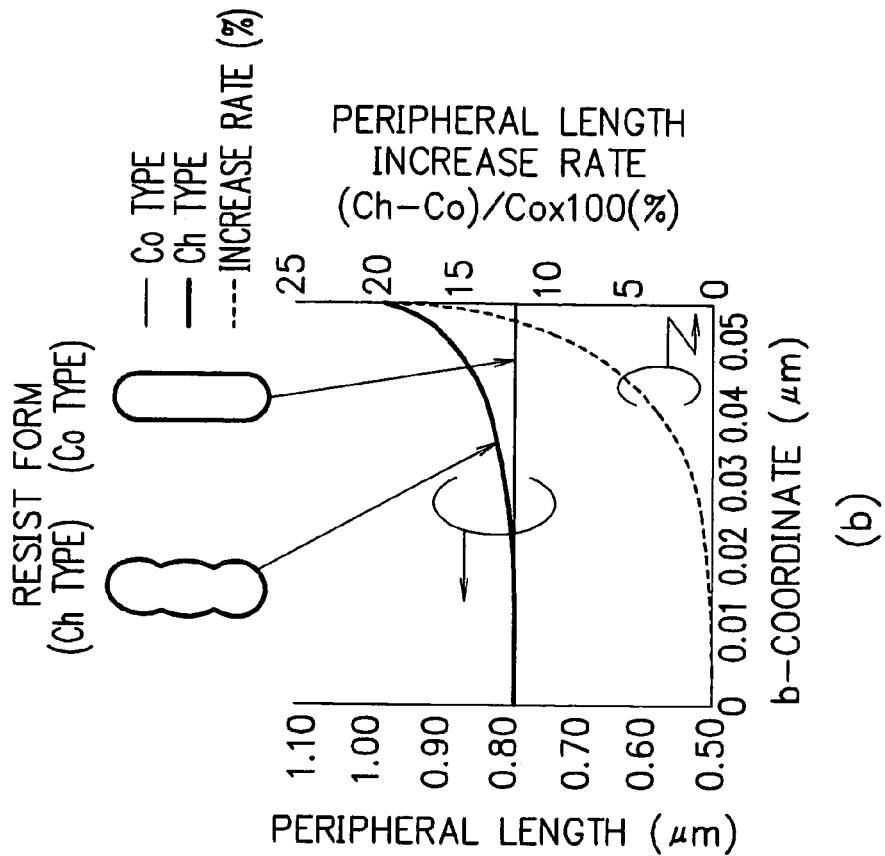
(a)
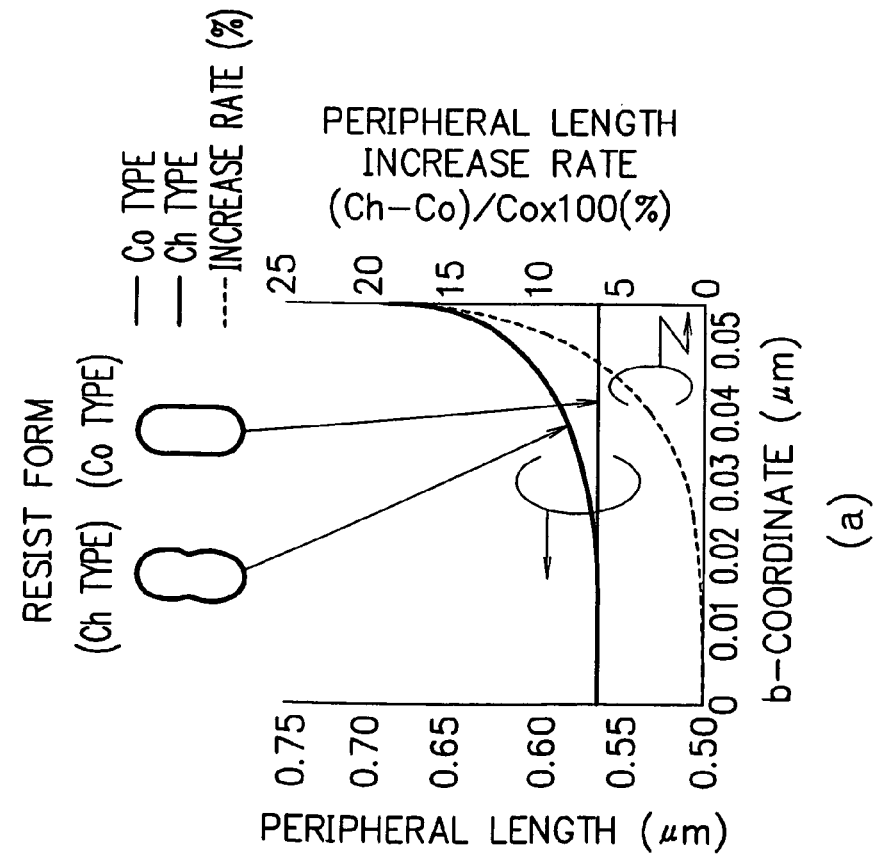
(b)

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Prior Art

In recent years, the speed of micro processing units built into electronic products such as communication devices and home electric appliances has been increased and they have been sophisticated. Accordingly it is demanded that a DRAM (Dynamic Random Access Memory) as a semiconductor device provides higher integration or higher capacity.

The memory cell is getting smaller and smaller to achieve LSI (Large Scale Integration) having a high-capacity DRAM. However, the electric charge of a capacitor used for a memory cell needs to be at least 30 to 50 fF (femtofarad: $10^{-15}$ F). The problem is how to form a high-capacity capacitor on a small chip. The problem can be solved by, for example, increasing the surface area of a capacitor, reducing the thickness of the insulator of a capacitor, or increasing dielectric constant of the insulator of a capacitor.

Applying those methods mentioned above, there have been utilized a stack cell (a cell whose surface area is raised by a coil type capacitor), a trench cell (a cell whose surface area is raised by a deep trench), a HSG (Hemi-Spherical Grain) cell (a cell whose surface area is raised by depositing hemispherical silicon grains on a surface), a RSTC (Reversed Stacked Capacitor) cell (a cell whose surface area is raised by a glass type capacitor). Besides, development research is being made concerning a STO film and a PZT film having high dielectric constant.

For example, the applicant of this invention manufactured 256 M bit DRAM in which 570 million devices are integrated on a silicon chip sized 13.6×24.5 mm by 0.25 µm CMOS (Complementary Metal-Oxide Semiconductor) process. Its memory cell has an area of around 0.72 µm².

FIG. 1(a) is a cross-section diagram showing a trench cell used for a DRAM as a conventional semiconductor device. FIG. 1(b) is a pattern diagram showing an appearance of crown type cylinders of the trench cell shown in FIG. 1(a).

In FIG. 1(a), broken line 120 indicates an insulating film of a capacitor called crown type cylinder.

A photomask is necessary in order to produce these crown type cylinders by photolithography. On the photomask, a plurality of cylinder patterns as mask patterns are formed at specified intervals.

FIG. 2 is a plan view showing an example of a conventional photomask used for the manufacture of a semiconductor device. FIG. 3 is a plan view showing another example of a conventional photomask used for the manufacture of a semiconductor device.

FIG. 2 shows a 6 $F^2$ ½ pitch cell type photomask on which rectangular cylinder patterns are formed. FIG. 3 shows a 8 $F^2$ ¼ pitch cell type photomask on which rectangular cylinder patterns, having reentrant angles at a pair of opposite corners of each rectangle, are formed. In FIGS. 2 and 3, resist form images have a long elliptic shape (according to the result of optical simulation).

There will be described these pitches of the cylinder patterns, 6 $F^2$ ½ pitch and 8 $F^2$ ¼ pitch.

F is equivalent to ½ of the pitch of word lines positioned in a memory cell of a DRAM. In the memory cell, a cell having a structure in which the minimum cell units are repeated, within the area of 2 F×3 F or 2 F×4 F is called "6 $F^2$ cell" or "8 $F^2$ cell", respectively. Regarding the pitch, provided that the distance between adjacent bit contacts connected with one bitline is 1 pitch, a cell having a structure in which device areas adjacent in the direction parallel to a bitline are offset with respect to one another by ½ pitch or ¼ pitch is called "½ pitch cell" or "¼ pitch cell", respectively.

The conventional 8 $F^2$ ¼ pitch and 6 $F^2$ ½ pitch DRAM cells have cylinder patterns of elliptic aperture with slenderness ratios in the range of 1.2 to 2.0 (the aperture form of a capacitor of a DRAM), which are densely disposed. In the above mentioned cylinder pattern, in order to ensure the maximum capacitance of a capacitor, a transcription exposure condition that can create the maximum area of each aperture is employed.

In order to maximize the lateral area of each aperture for forming a storage capacitor film, the resist pattern mentioned above is used as an etch mask, and high-aspect deep apertures are fabricated. For example, such techniques are described in Japanese Patent Application laid open No. HEI 10-242417 and also in "Nikkei Microdevices Vol. 11" pp. 86–87, Nikkei Business Publications. Inc., Nov. 1, 2003.

Incidentally, because of the minimization of design with high-integration, cylinder patterns can occupy smaller area, and apertures cannot be enlarged. As a result, the enough peripheral length of an aperture cannot be attained, which causes the difficulty of ensuring an desired capacitance.

Besides, when forming a high-aspect microscopic crown structure, a surface tension arisen during wafer surface finishing by wet chemical processing acts as stress to the side of a cylinder. Therefore, the patterns will be broken as shown in FIG. 1(b).

To increase the capacitance of a cylinder type capacitor of the current laminated structure by utilizing existing dielectric materials and electrodes, there is no other way than to enlarge the peripheral length of the cylinder aperture and further deepen the cylinder depth as compared to those of an existing cylinder.

However, because the aperture of an existing cylinder has a long elliptic shape as shown in FIGS. 2 and 3, there is obviously no other choice than to enlarge the aperture area to increase the peripheral length of the aperture.

Also, when the aperture area is enlarged with a fixed pitch, it is difficult to achieve an agreeable resist form because the width between adjacent patterns becomes considerably narrow. Under such circumstances, it becomes difficult to etch while leaving enough margins between adjacent aperture patterns.

Furthermore, as the sidewall of a cylinder has a very high and thin film structure with aspect 10, which causes degradation in mechanical strength to the stress against the side of the cylinder.

SUMMARY OF THE INVENTION

It is therefore an object of the present invention to provide a semiconductor device and a manufacturing method thereof that can increase the peripheral length of an aperture without changing the occupation rate of patterns in a cell and increase the mechanical strength of cylinders in the cell.

To overcome the problems mentioned above, according to the first aspect of the present invention, there is provided a deep sub-half micron semiconductor device comprising cylinder type capacitors in a concave shape on a wafer, wherein each of apertures on the wafer is constricted in the middle in nearly a cocoon shape.

In the first aspect, by forming a slit in the middle of each pattern so as not to expose parts of the wafer, each of the apertures on the wafer becomes nearly cocoon-shaped with a constriction in the middle. Thus, it is possible to increase the peripheral length of the aperture without changing the occupation rate of the patterns in a cell.

According to the second aspect of present invention, there are a plurality of constrictions in the middle of the aperture.

According to the third aspect of the present invention, the cylinder type capacitors are part of a DRAM device.

According to the fourth aspect of present invention, there is provided a manufacturing method of a deep sub-half micron semiconductor device, comprising the steps of coating a wafer with a resist, replicating mask patterns on the resist with a photomask, and forming cylinder type capacitors in a concave shape by photolithography, wherein a slit is formed in the middle of each mask pattern on the photomask so as not to expose parts of the wafer, and each of apertures on the wafer is constricted in the middle in nearly a cocoon shape.

According to the fifth aspect of the present invention, the mask pattern has the shape of a rectangle divided in the middle by the slit.

According to the sixth aspect of the present invention, the mask pattern has the shape of a rectangle with reentrant angles at a pair of opposite corners and divided by the slit crossing both the reentrant angles.

By forming one or more slits in the middle of the mask pattern so as not to expose parts of the wafer, each of the apertures on the wafer, each of the apertures on the wafer becomes nearly cocoon-shaped with one or more constrictions in the middle. Thus, it is possible to increase the peripheral length of the aperture without changing the occupation rate of the patterns in a cell. Further, the shape of the bottom surface of the aperture also becomes nearly cocoon-shaped with one or more constrictions in the middle. Therefore, it is possible to increase the mechanical strength of cylinders.

BRIEF DESCRIPTION OF THE DRAWINGS

The above and further objects and novel features of the invention will be more fully understood from the following detailed description when the same is read in connection with the accompanying drawings in which:

FIG. 1(a) is a section view showing a trench cell used for a DRAM as a conventional semiconductor device;

FIG. 1(b) is a pattern diagram showing the appearance of crown type cylinders of the trench cell depicted in FIG. 1(a);

FIG. 6(a) is a section view of crown type cylinders of a DRAM;

FIG. 6(b) is a diagram showing the appearance of a cylinder of a conventional DRAM;

FIG. 6(c) is a diagram showing the appearance of a cylinder of the present invention;

FIG. 7(a) is a graph showing an optic image of a mask layout with respect to each slit width by obtaining the optical power distribution according to optical simulation;

FIG. 7(b) is a diagram showing the positional relationship between mask patterns;

FIG. 12(a) is a graph showing the degree of dependence of the peripheral length corresponding to the degree of constriction of a cylinder pattern in the 6 $F^2\frac{1}{2}$ pitch cell (approximating two inscribing circles); and FIG. 12(b) is a graph showing the degree of dependence of peripheral length corresponding to the degree of constrictions of a cylinder pattern in the 6 $F^2\frac{1}{2}$ pitch cell (approximating three inscribing circles).

DETAILED DESCRIPTION OF THE PREFERRED EMBODIMENTS

Figure 2:
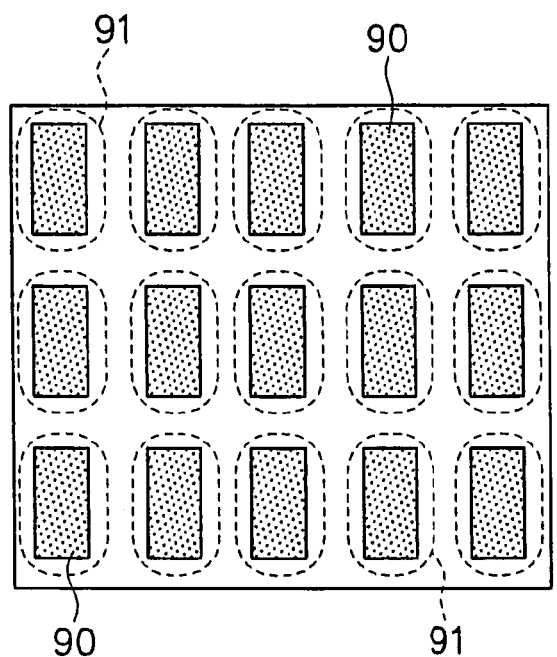
FIG. 2 is a plan view showing an example of a conventional photomask utilized for the manufacture of a semiconductor device.

Referring now to the drawings, a description of preferred embodiments of the present invention will be given in detail.

Figure 4:
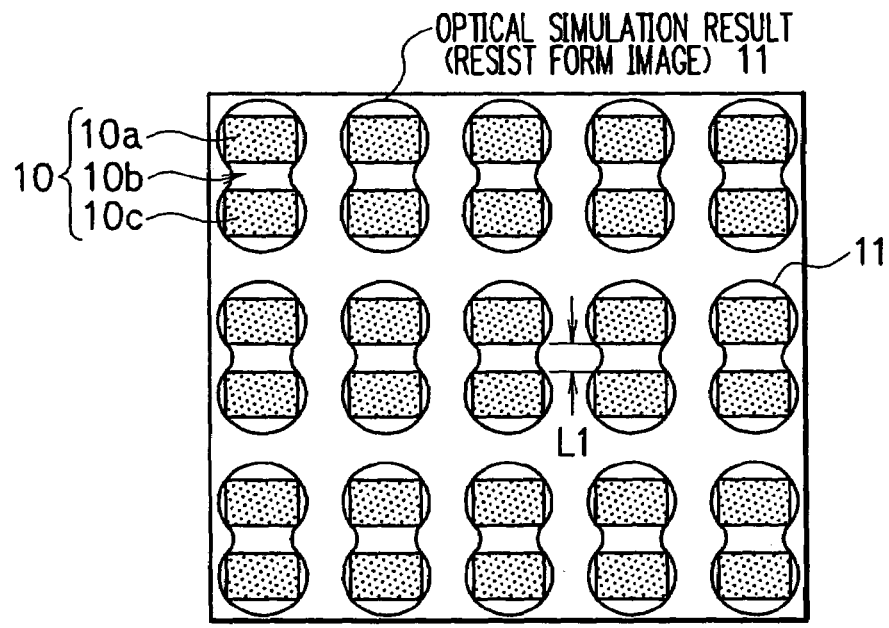
FIG. 4 is a plan view showing mask patterns on a photomask for manufacturing a semiconductor device and an optical image according to an embodiment of the present invention.

FIG. 4 is a plan view showing mask patterns on a photomask for manufacturing a semiconductor device and an optical image according to an embodiment of the present invention.

Figure 5:
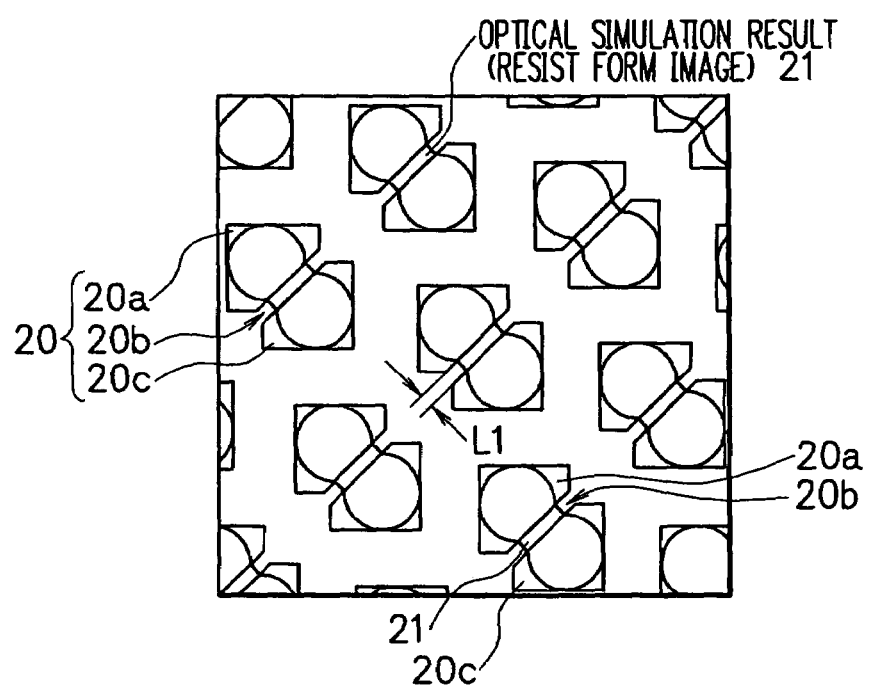
FIG. 5 is a plan view showing mask patterns on a photomask for manufacturing a semiconductor device and an optical image according to another embodiment of the present invention.

FIG. 5 is a plan view showing mask patterns on a photomask for manufacturing a semiconductor device and an optical image according to another embodiment of the present invention.

Figure 3:
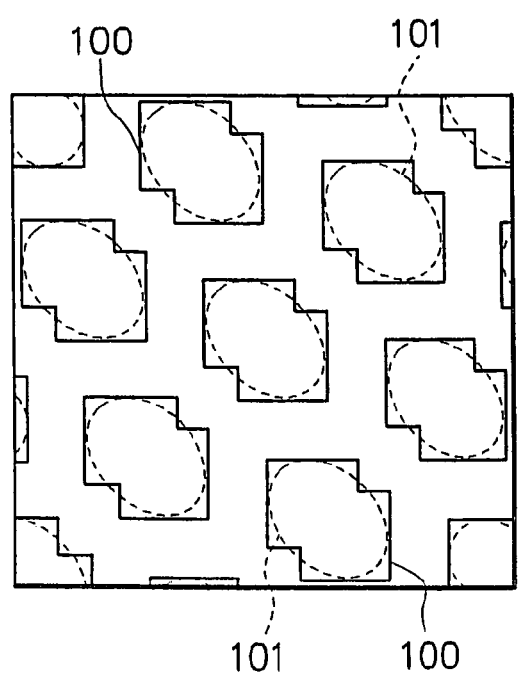
FIG. 3 is a plan view showing another example of a conventional photomask utilized for the manufacture of a semiconductor device.

According to the embodiments of the present invention, in cylinder patterns in a 6 $F^2\frac{1}{2}$ pitch DRAM cell (shown in FIG. 4) and cylinder patterns in a 8 $F^2\frac{1}{4}$ pitch DRAM cell (shown in FIG. 5), by forming the shape of the top of each cylinder from a conventional long elliptic shape (shown in FIGS. 2 and 3) into a nearly cocoon shape with one or more constrictions in the middle, the peripheral length of the apertures is increased without changing the occupation rate of patterns in a DRAM cell.

A masking slit having an assist feature is inserted in the middle of each cylinder mask pattern in a conventional DRAM cell. The cylinder aperture pattern having such slit formed by replicating a mask on a wafer using reduced projection exposure has the longer peripheral length as compared to the one without a slit. As a photolithography machine, a high-NA reduced projection exposure machine is used to select and replicate an illumination optical system with high-resolution performance and high-coherent properties.

That is, according to a manufacturing method of a deep sub-half micron semiconductor device of the present invention, a resist is coated on a wafer, and then mask patterns are replicated on the resist with a photomask to form cylinder type capacitors in a concave shape by photolithography. A slit is formed in the middle of each mask pattern on the photomask so as not to expose parts of the wafer. With the photomask, each of apertures on the wafer is constricted in the middle in nearly a cocoon shape.

Mask patterns each have the shape of a rectangle divided in the middle by the slit, or the shape of a rectangle with reentrant angles at a pair of opposite corners which is divided by the slit crossing both the reentrant angles (both the shapes are called "Chevron").

In addition, the deep sub-half micron semiconductor device obtained by the semiconductor manufacturing method of the present invention comprises cylinder type capacitors in a concave shape on a wafer. Each of apertures on the wafer is nearly cocoon-shaped with a constriction in the middle. There can be a plurality of constrictions in the middle of the aperture. The cylinder type capacitors may be part of the DRAM device.

Consequently, the surface area of sidewall inside each cylinder increases by 20 to 30% compared to that of a conventional cylinder. Thus the equivalent increase of capacitance is expected.

FIG. 6(a) is a section view of crown type cylinders of a DRAM, FIG. 6(b) is a diagram showing the appearance of a cylinder of a conventional DRAM, and FIG. 6(c) is a diagram showing the appearance of a cylinder of the present invention. As shown in FIG. 6(c), the quasi-H shape of the cross section of the cylinder increases the mechanical strength against the stress in the direction of the slit. Thus, the process for obtaining a stable high-aspect crown structure as shown in FIG. 6 can be achieved.

FIG. 7(a) is a graph showing an optic image of a mask layout with respect to various slit widths (refer to FIGS. 4 and 5) obtained by calculating the optical power distribution according to optical simulation. FIG. 7(b) is a diagram showing the positional relationship between mask patterns.

In FIG. 7(a), the horizontal axis indicates the slit width (L1) on the mask and the vertical axis indicates the width of the constricted part in the middle of the aperture (L2).

The slice level of optical power corresponding to the process condition is determined based on the minimum distance (L3 in FIG. 7(b)) between adjacent patterns as a fixed value.

Figure 8:
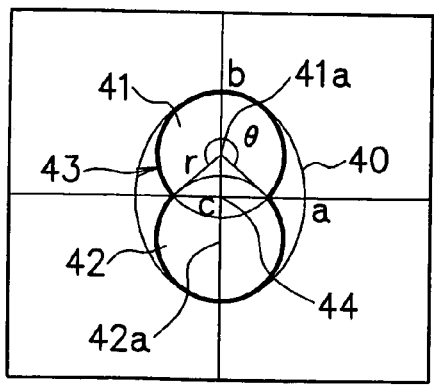
FIG. 8 is a comparative diagram showing the shape of the aperture of a cylinder with a constriction in the middle (approximating two inscribing circles in a 8 $F^2\frac{1}{4}$ pitch cell) and that of a conventional elliptic type cylinder.

FIG. 8 is a comparative diagram showing the shape of the aperture of a cylinder with a constriction in the middle (approximating two inscribing circles in the 8 $F^2$¼ pitch cell) and that of a conventional elliptic type cylinder pattern. In FIG. 8, the shape of an aperture 43 of a cylinder approximates aggregation of two circles 41 and 42 inscribed in a conventional elliptic pattern 40. The inscribing circles 41 and 42 overlap with their respective center points 41a and 42a away from a center point 44 by distance b.

Figure 9:
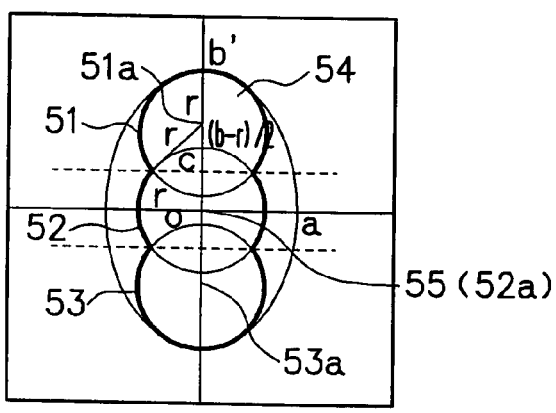
FIG. 9 is a comparative diagram showing the shape of the aperture of a cylinder with two constrictions in the middle (approximating three inscribing circles in a 8 $F^2\frac{1}{4}$ pitch cell) and that of a conventional elliptic type cylinder.

FIG. 9 is a comparative diagram showing the shape of the aperture of a cylinder with two constrictions in the middle (approximating three inscribing circles in the 8 $F^2$¼ pitch cell) and that of a conventional elliptic type cylinder. In FIG. 9, the shape of an aperture 54 approximates aggregation of three circles 51, 52 and 53 inscribed in a conventional elliptic pattern 50. The inscribing circles 51, 52 and 53 overlap with the center points 51a and 53a of circles 51 and 53 away from a center point 55 (52a) by distance b'.

Figure 10:
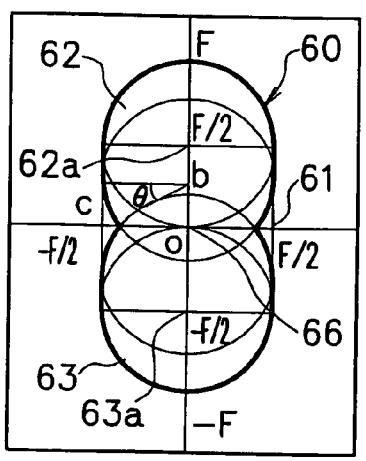
FIG. 10 is a comparative diagram showing the shape of the aperture of a cylinder with a constriction in the middle (approximating two inscribing circles in a 6 $F^2\frac{1}{2}$ pitch cell) and that of a conventional elliptic type cylinder.

FIG. 10 is a comparative diagram showing the shape of the aperture of a cylinder with a constriction in the middle (approximating two inscribing circles in the 6 $F^2$½ pitch cell) and that of a conventional elliptic type cylinder. In FIG. 10, the shape of an aperture 60 approximates aggregation of two circles 62 and 63 inscribed in a conventional elliptic pattern 61. The inscribing circles 62 and 63 overlap with their respective center points 62a and 63a away from a center point 66 by distance b.

Figure 11:
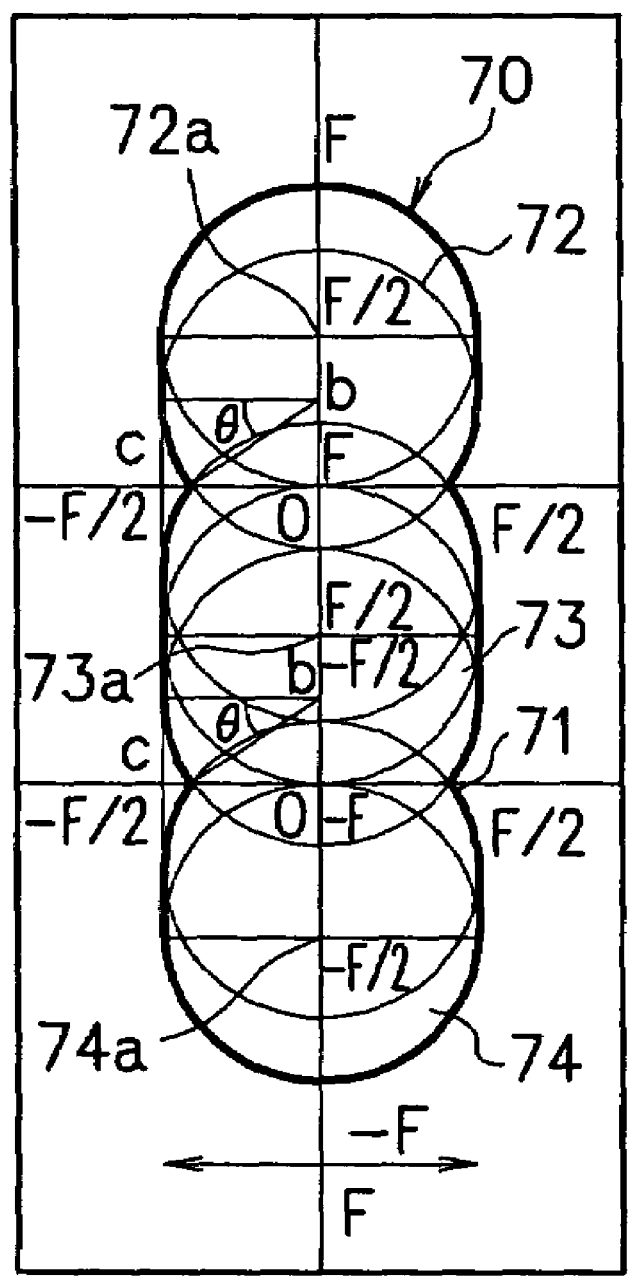
FIG. 11 is a comparative diagram showing the shape of the aperture of a cylinder with two constrictions in the middle (approximating three inscribing circles in a 6 $F^2\frac{1}{2}$ pitch cell) and that of a conventional elliptic type cylinder.

FIG. 11 a comparative diagram showing the shape of the aperture of a cylinder with two constrictions in the middle (approximating three inscribing circles in the 6 $F^2$½ pitch cell) and that of a conventional elliptic type cylinder. In FIG. 11, the shape of an aperture 70 approximates aggregation of three circles 72, 73 and 74 inscribed in a conventional elliptic pattern 71. The inscribing circles 72, 73 and 74 overlap with their respective center points 72a, 73a and 74a away from a center point by distance b.

Consequently, the degree of constriction of the nearly cocoon shape depends on the value of b (b').

FIG. 12(a) shows the degree of dependence of the peripheral length of the aperture corresponding to the degree of constriction of a cylinder pattern in the 6 $F^2$½ pitch cell (approximating two inscribing circles). FIG. 12(b) shows the degree of dependence of the peripheral length of the aperture corresponding to the degree of constriction of a cylinder pattern in the 6 $F^2$½ pitch cell (approximating three inscribing circles).

As can be seen in FIGS. 12(a) and 12(b), when the value of b is 0, the nearly cocoon-shaped pattern virtually does not have any constrictions. In other words, the pattern is of the same shape as the conventional elliptic shape. As the value of b increases, the degree of constriction (constriction value) of the cocoon-shaped pattern increases, and the peripheral length grows exponentially. The maximum value of b is F/2, that is, the maximum value of b=0.55 μm concerning the 0.11 μm DRAM. With the maximum value, the possible value of the degree of constriction of the pattern and the peripheral length becomes the maximum.

By this process technique mentioned above, the peripheral length of each cylinder pattern increases at maximum by 20 to 30% as compared to that of a cylinder pattern without a constriction.

In the following, a description will be given of the first embodiment of the present invention.

The applicant of this invention is developing and manufacturing, as vehicles, 512 Mbit DRAM A masks each having a ½ pitch 6 $F^2$ cell structure with the minimum width of a process line of 0.13 μm (already developed) and a 256 Mbit DRAM J mask family having a ¼ pitch 8 $F^2$ cell structure (being mass-produced).

The narrower the process line and the smaller the cell, the more chips can be acquired from a single Si wafer for the DRAM. Accordingly, the unit price of the chip can be reduced, which enhances competitiveness in costs.

Meanwhile, since the capacitance of storage capacitor electrodes decreases with the diminution of cell size, it becomes difficult to maintain required memory retention characteristics of the DRAM. Further, when the cell size is decreased from 8 $F^2$ (2 F×4 F) to 6 $F^2$ (2 F×3 F), the capacitance of a capacitor decreases by about 20 to 30% according to the design rule. Therefore, it is necessary to use new material for a dielectric layer and electrodes or to form deeper cylindrical storage electrodes to widen the area covered by the dielectric layer. However, both methods need a new process technique, and the technical barrier is really high.

As a capacitor device of the above mentioned process generation, the applicant of the present invention adopts a cylinder type one, in which a deep hole with an elliptic-shaped bottom is formed in an insulating layer (indicated by broken line 112 in FIG. 6(a)), and a dielectric layer and a conducting layer are formed on the inner wall of the hole to obtain a storage electrode.

To ensure more capacitance with the same materials for a dielectric layer and an electrode, the area S coated with a dielectric layer (peripheral length 111×depth 110 of an aperture) is widened (FIG. 6(b)) by increasing the aspect rate (make depth 110 deeper) of the deep hole which is coated with a dielectric layer to function as a capacitor. However, the process for creating high-aspect deep holes needs higher etching technology, and it is impossible to realize the high aspect process beyond the limit.

According to the present invention, the top and bottom of the cylinder type capacitor are formed into a nearly cocoon shape approximating that of two or three partially overlapping circles. Thus, the peripheral length of an aperture can be increased, at maximum, by 20 to 30% (FIG. 6(c)). In consequence, the capacitance can be increased, at maximum, by 20 to 30% in speculation without using a new high dielectric layer or a new electrode material and changing a cylinder aspect in the conventional process form.

The applicant of the present invention is developing and manufacturing as a development vehicle by the most advanced DRAM process a 1 Gbit DRAM having a ¼ pitch 8 $F^2$ cell structure with the minimum width of a process line of 0.11 μm by way of trial.

In this case, it is also difficult to maintain required memory retention characteristics of the DRAM because the capacitance of storage capacitor electrodes decreases with the diminution of cell size.

The applicant of present invention is developing crown type capacitors of an aspect ratio equivalent to that of a conventional capacitors which can store more charge without changing a dielectric layer or an electrode material by coating the inside and outside walls of each cylinder with a dielectric layer (indicated by broken line 120 in FIG. 1(a)).

In spite of its high-aspect, the cylinders have a very thin inside wall and the mechanical strength against the cross-sectional stress from the side is really small. For that reason, the side of each cylinder is broken locally (indicated by broken line 121 in FIG. 1(b)).

The top and bottom surface of conventional cylinder type (crown type) capacitors are long elliptic donuts-shaped, and they are in close formation in the direction of the minor axis. Therefore the surface tension of water or a chemical or etching agent in the direction of the minor axis becomes maximum in wet process or the like, thus braking and collapsing each cylinder type capacitor.

According to the present invention, each cylinder type (crown type) capacitor has nearly cocoon-shaped top and bottom surfaces each having the shape of two or three inscribing circles. Therefore, flared parts of the nearly cocoon-shaped cylinder serves as a support against the stress in the direction of the minor axis, and prevents the breakages and collapse of cylinders.

A storage capacitor electrode (or a capacitor) of a DRAM device, when it is a high-integrated DRAM of Gbit-scale, needs to ensure at least 30 fF of capacitance. However, the occupation area of capacitor patterns in a cell on a layout decreases as more devices are integrated. This means that it is difficult to increase the peripheral length of the aperture of the cylinder type capacitor with a concave shape. Therefore, the enlargement of the inner surface area of the cylinder cannot be expected, which makes it difficult to increase the capacitance.

The semiconductor manufacturers focus on the crown type cylinders having a higher sidewall and using both inside and outside walls as the capacitor area to overcome the dilemma of reduction in design rule size and increase in capacitance. This process needs the development of an etching technique to achieve deep and vertical apertures and increase of mechanical strength against the stress on the sidewalls of the cylinders, but the difficulty of the process is really high.

According to the present invention, in cylinder patterns of a 0.13 μm DRAM cell with 6 $F^2$½ pitch, to ensure capacitance of storage capacitor electrodes, the method of forming cylinder patterns is improved in the lithography process without changing the exiting cylinder forming process. This technology can be applied to 8 $F^2$¼ pitch cell type.

While preferred embodiments of the invention have been described using specific terms, the description has been for illustrative purpose only, and it is to be understood that changes and variations may be made without departing from the spirit or scope of the following claims.

What is claimed is:

1. A deep sub-half micron semiconductor device comprising cylinder type capacitors in a concave shape on a wafer, wherein each of the capacitors has a separate aperture, and wherein each of the apertures on the wafer is constricted in the middle in nearly a cocoon shape.

2. A deep sub-half micron semiconductor device comprising cylinder type capacitors in a concave shape on a wafer, wherein each aperture on the wafer is constricted in the middle, wherein there are a plurality of constrictions in the middle of the aperture.

3. The semiconductor device claimed in claim 1, wherein the cylinder type capacitors are part of a DRAM device.

4. The semiconductor device claimed in claim 2, wherein the cylinder type capacitors are part of a DRAM device.

* * * * *